(12) United States Patent
Watson et al.

(10) Patent No.: US 9,470,225 B2
(45) Date of Patent: Oct. 18, 2016

(54) COMPRESSORS AND METHODS FOR DETERMINING OPTIMAL PARKING POSITIONS FOR COMPRESSOR PISTONS

(71) Applicant: General Electric Company, Schenectady, NY (US)

(72) Inventors: Eric K. Watson, Crestwood, KY (US); Richard Dana Brooke, Louisville, KY (US); Timothy Neal Johnson, Palmyra, IN (US); Meher Prasadu Kollipara, Louisville, KY (US)

(73) Assignee: Haier US Appliance Solutions, Inc., Wilmington, DE (US)

( * ) Notice: Subject to any disclaimer, the term of this patent is extended or adjusted under 35 U.S.C. 154(b) by 79 days.

(21) Appl. No.: 14/518,250

(22) Filed: Oct. 20, 2014

(65) Prior Publication Data

US 2016/0108905 A1    Apr. 21, 2016

(51) Int. Cl.
*F04B 51/00*       (2006.01)
*G01R 25/00*       (2006.01)
*G01R 31/34*       (2006.01)

(52) U.S. Cl.
CPC ............... *F04B 51/00* (2013.01); *G01R 25/00* (2013.01); *G01R 25/005* (2013.01); *G01R 31/34* (2013.01)

(58) Field of Classification Search
None
See application file for complete search history.

(56) References Cited

U.S. PATENT DOCUMENTS

| | | | |
|---|---|---|---|
| 4,664,608 A | 5/1987 | Adams et al. | |
| 6,112,535 A | 9/2000 | Hollenbeck | |
| 8,245,531 B2 | 8/2012 | Takahashi et al. | |
| 9,109,590 B2 * | 8/2015 | Meza et al. | F04B 43/0054 |
| 2009/0324428 A1 * | 12/2009 | Tolbert, Jr. | F04B 39/0207 417/44.1 |
| 2015/0176579 A1 * | 6/2015 | Lim et al. | F04B 35/04 62/230 |

FOREIGN PATENT DOCUMENTS

EP    1 876 341    1/2008

* cited by examiner

*Primary Examiner* — Patrick Assouad
*Assistant Examiner* — Douglas X Rodriguez
(74) *Attorney, Agent, or Firm* — Dority & Manning, P.A.

(57) ABSTRACT

Compressors and methods for determining optimal parking positions for compressor pistons are provided. A method includes performing a current value evaluation for an initial time during operation of a motor of the compressor. Performing the current value evaluation includes measuring a motor current value at the time and comparing the motor current value to an existing optimal parking current value. Performing the current value evaluation further includes modifying the existing optimal parking current value to the motor current value when the motor current value exceeds or is equal to the existing optimal parking current value.

18 Claims, 7 Drawing Sheets

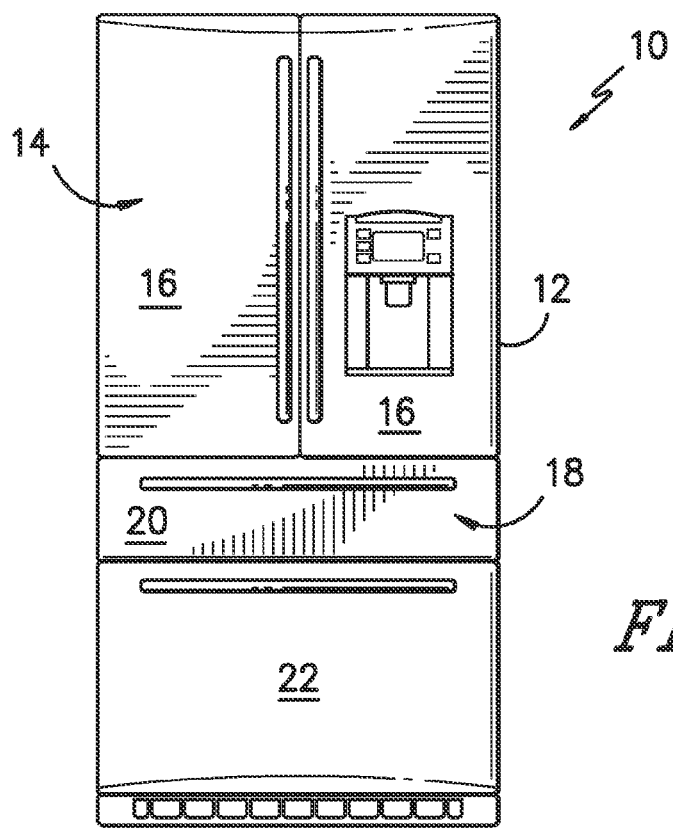
FIG. -1-
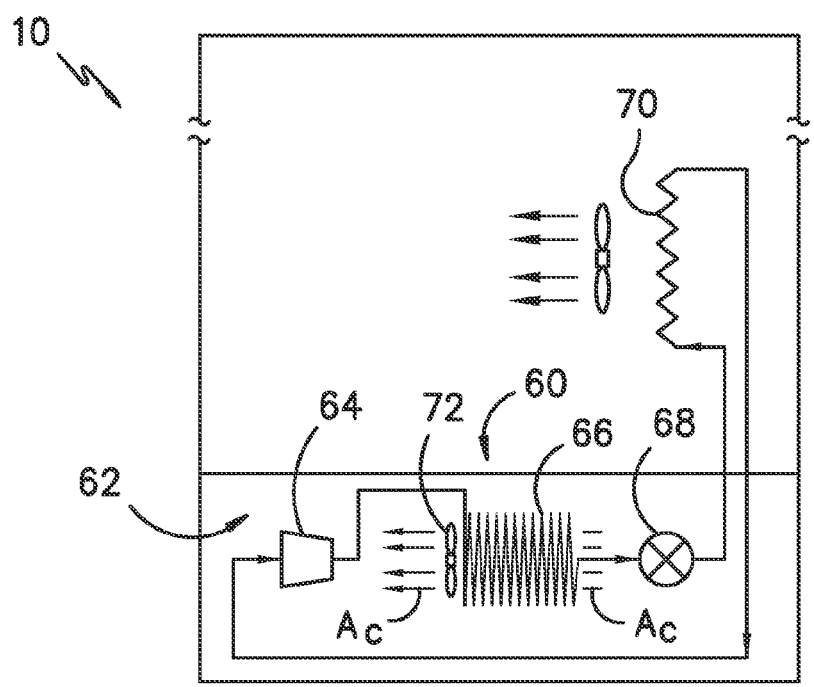
FIG. -2-

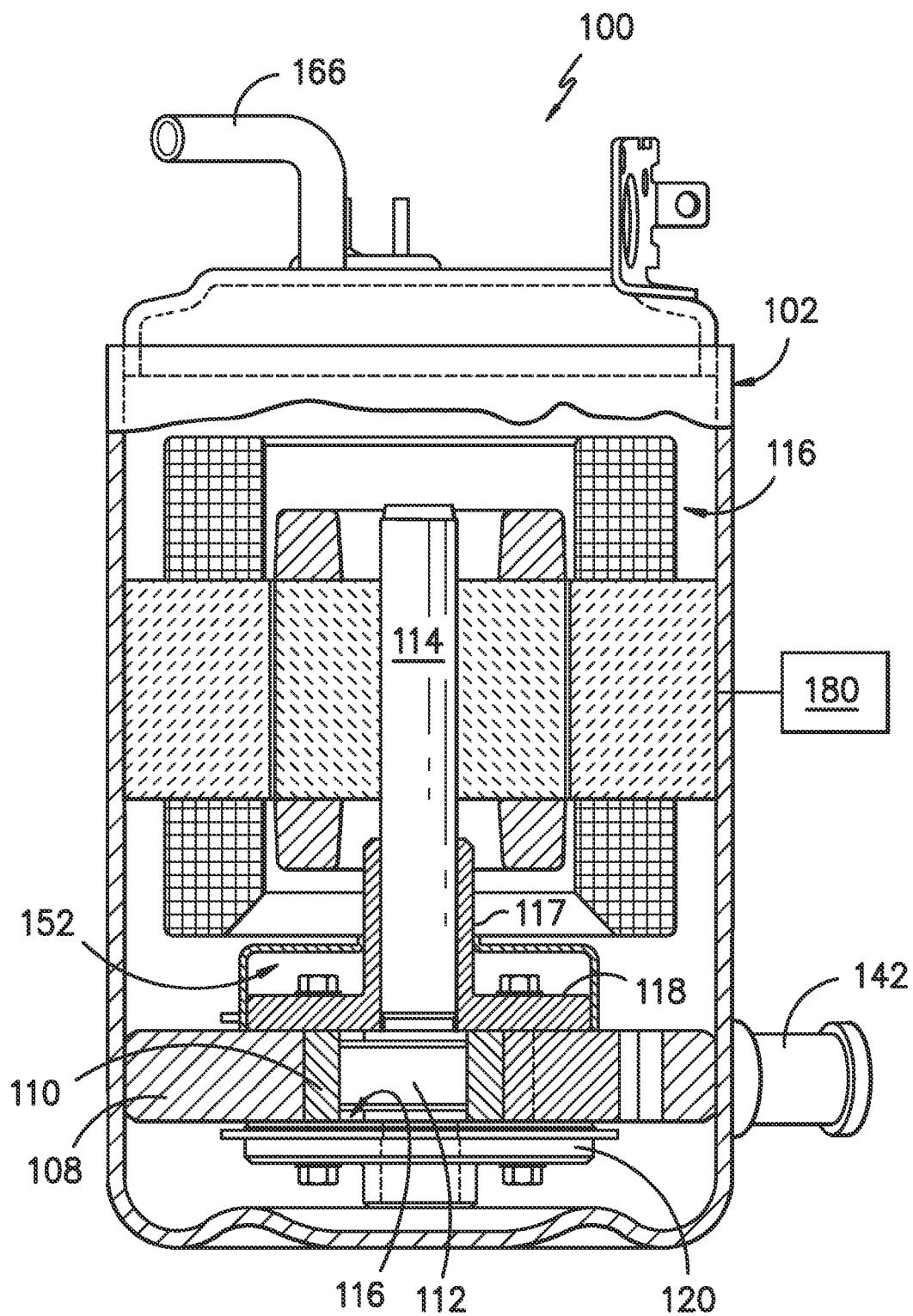
FIG. -3-

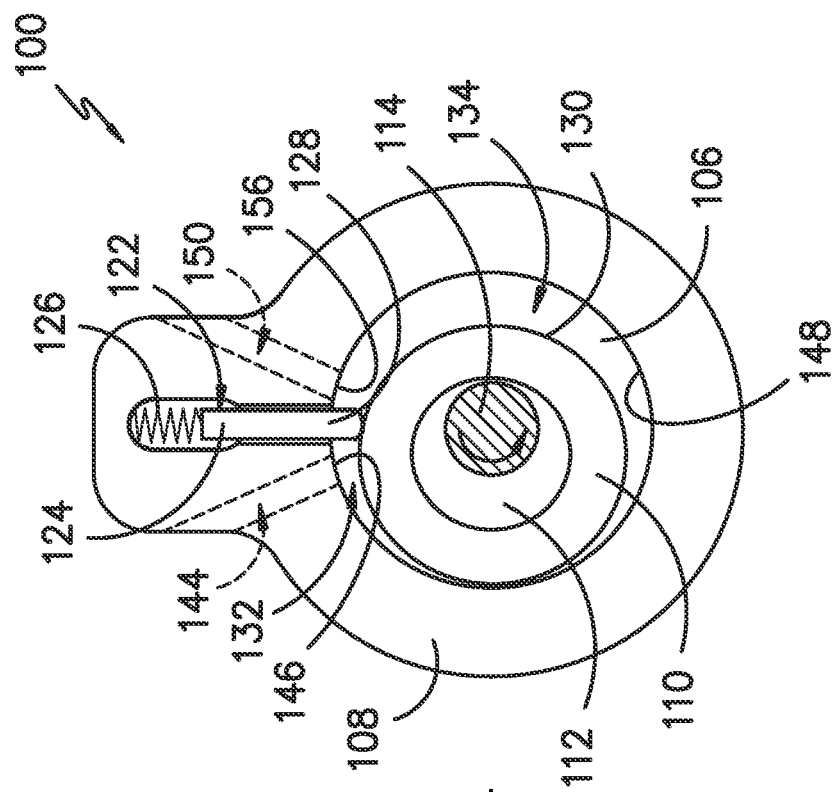
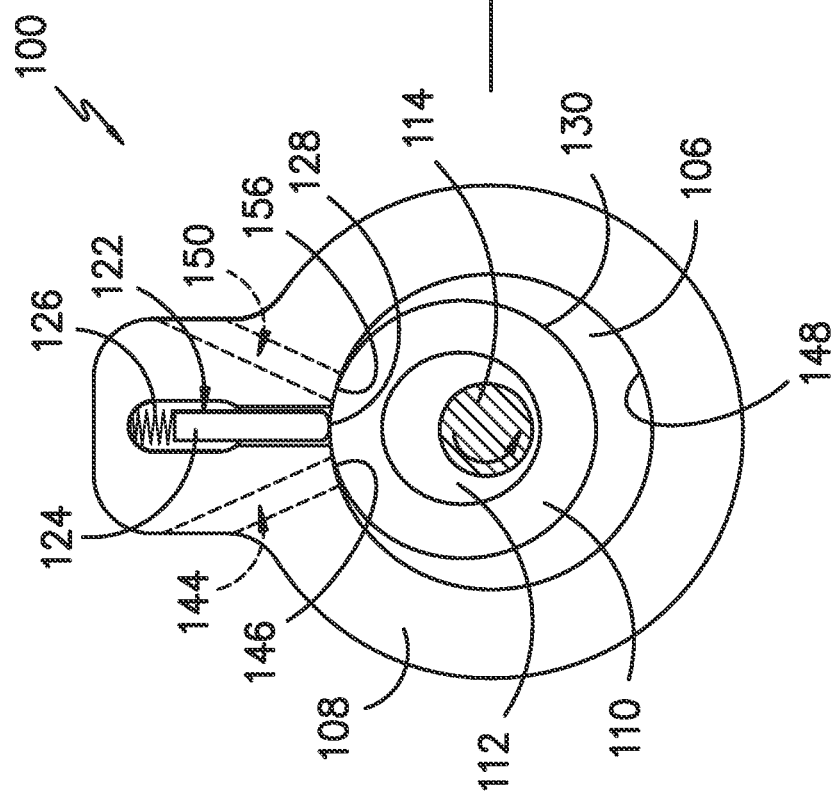

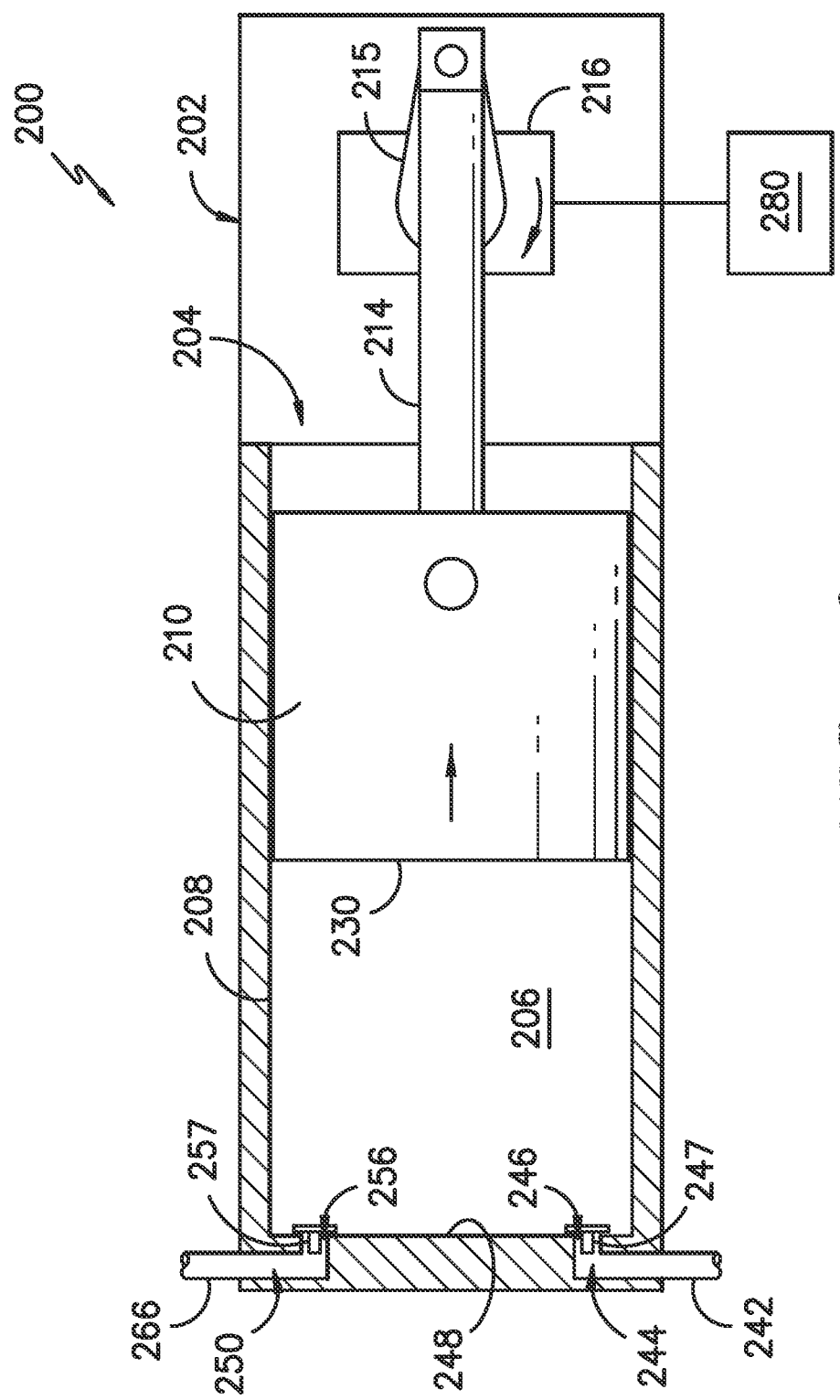
FIG. -6-

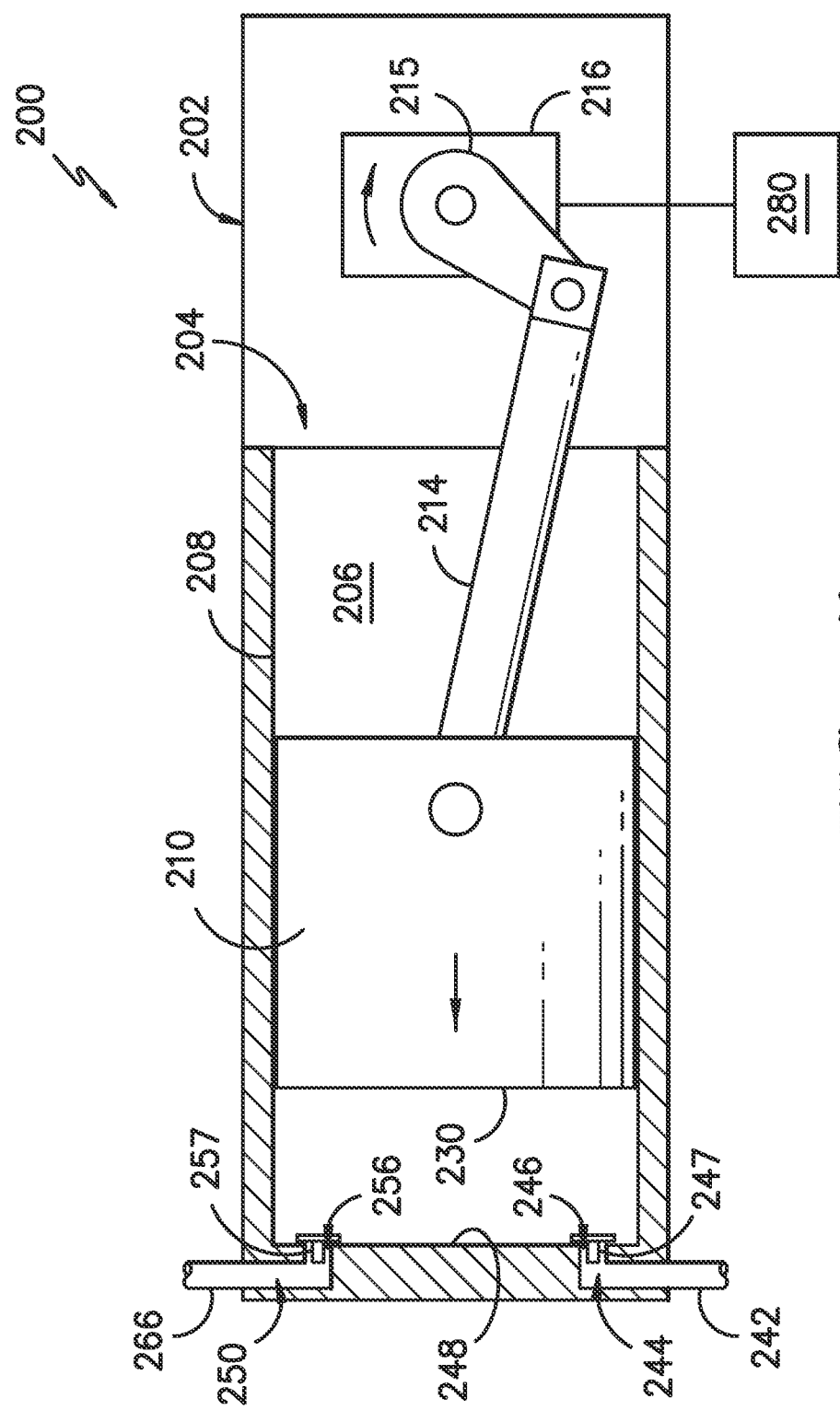
FIG. -7-

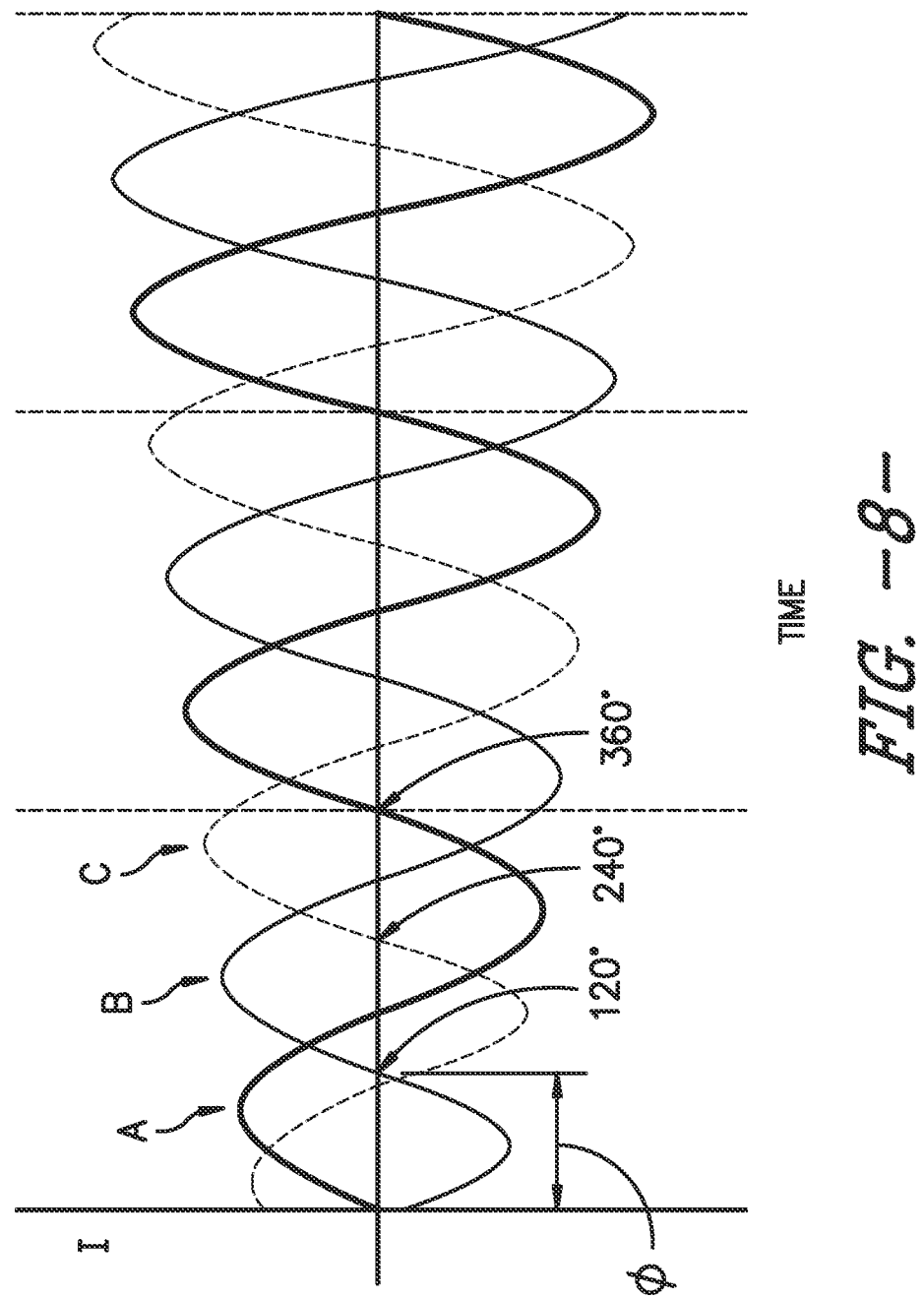
FIG. -8-

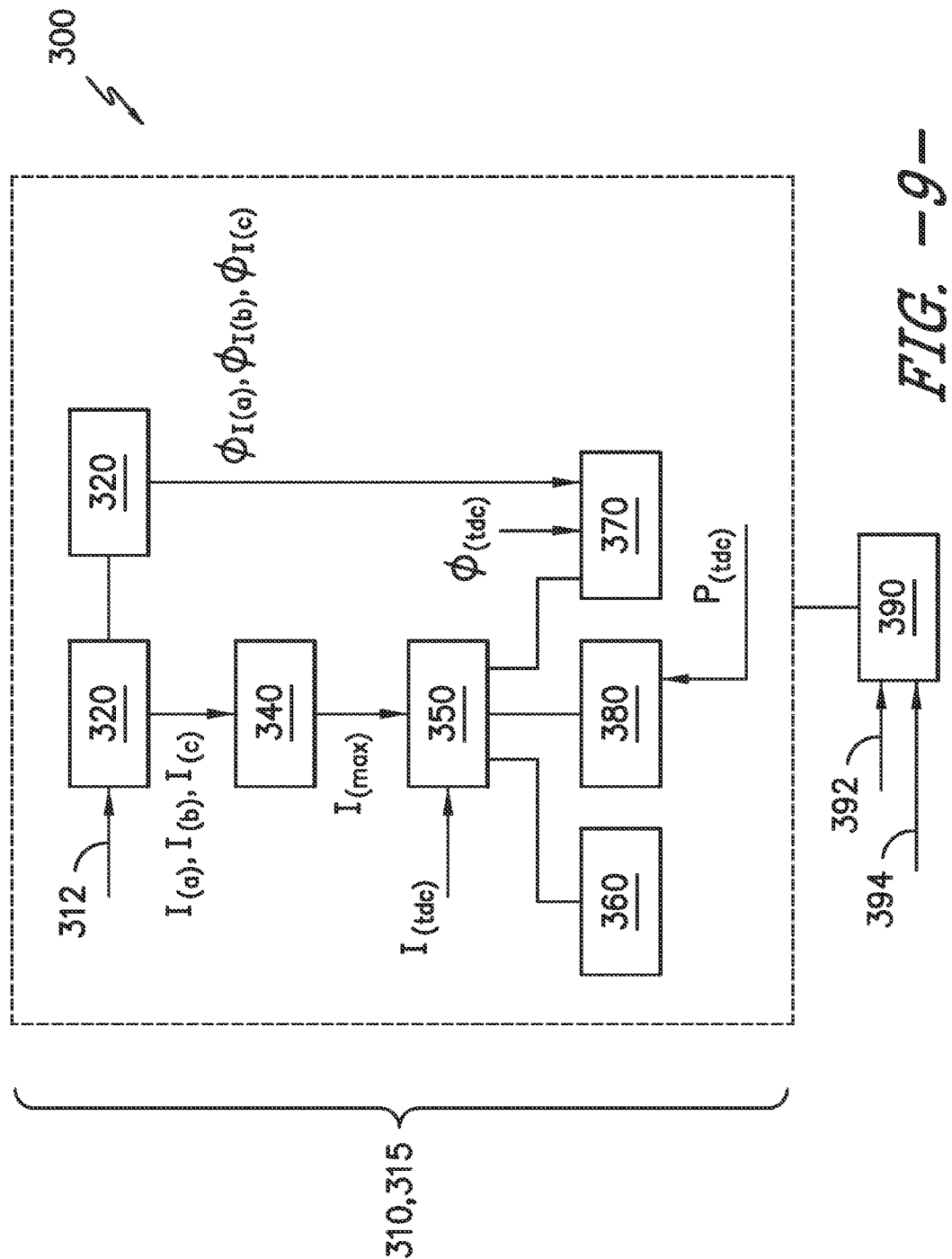
FIG. -9-

COMPRESSORS AND METHODS FOR DETERMINING OPTIMAL PARKING POSITIONS FOR COMPRESSOR PISTONS

FIELD OF THE INVENTION

The present subject matter relates generally to positive displacement compressors, and more specifically to methods for determining optimal parking positions for compressor pistons of compressors.

BACKGROUND OF THE INVENTION

Certain refrigerator appliances include sealed systems for cooling chilled chambers of the refrigerator appliance. The sealed systems generally include a compressor that generates compressed refrigerant during operation of the sealed system. The compressed refrigerant flows to an evaporator where heat exchange between the chilled chambers and the refrigerant cools the chilled chambers and food items located therein.

A typical compressor, such as a reciprocating or rotary compressor, includes a piston which is driven by a motor. Motion of the piston compresses refrigerant, which is then flowed from a chamber in which the piston is housed. A reciprocating compressor typically includes a piston which has a linear motion, a chamber in which the piston is housed, an inlet (or suction) passage for supplying refrigerant to the chamber, and an outlet (or discharge) passage for flowing the compressed refrigerant from the chamber. During operation, the piston moves in a reciprocating manner along the linear path between an optimal parking position, such as top or bottom dead center position, and various other positions. A rotary compressor typically includes a piston which has an eccentric rotational motion, a chamber in which the piston is housed, an inlet (or suction) passage for supplying refrigerant to the chamber, and an outlet (or discharge) passage for flowing the compressed refrigerant from the chamber. During operation, the piston moves along an eccentric rotational path between an optimal parking position, such as top or bottom dead center position, and various other positions.

One issue that can occur for many compressors is refrigerant backflow when the motor is turned off. In particular, refrigerant can flow back from the discharge passage into the chamber. This can cause additional energy consumption during a refrigeration cycle and result in inefficient cooling and energy loss. One solution for reducing or preventing such backflow is to place the piston at an optimal parking position, such as top dead center, when the motor is turned off and movement of the piston is stopped. This would completely or substantially seal the inlet and outlet passages and reduce or prevent backflow. However, determination of when the piston is at this optimal parking position in order to turn the motor off at a particular time such that the piston stops at or approximately at the optimal parking position, is difficult and frequently inaccurate.

Accordingly, improved methods for determining optimal parking positions for compressor pistons, and associated compressors, are desired in the art. In particular, methods which facilitate real time updates of a stored optimal parking position for a compressor piston during operation, and which provide relatively accurate optimal parking position determinations, would be advantageous.

BRIEF DESCRIPTION OF THE INVENTION

Additional aspects and advantages of the invention will be set forth in part in the following description, or may be apparent from the description, or may be learned through practice of the invention.

In accordance with one embodiment, a method for determining an optimal parking position for a compressor piston is provided. The method includes performing a current value evaluation for an initial time during operation of a motor of the compressor. Performing the current value evaluation includes measuring a motor current value at the time and comparing the motor current value to an existing optimal parking current value. Performing the current value evaluation further includes modifying the existing optimal parking current value to the motor current value when the motor current value exceeds or is equal to the existing optimal parking current value.

In accordance with another embodiment, a method for determining an optimal parking position for a compressor piston is provided. The method includes performing a current value evaluation for an initial time during operation of a motor of the compressor. Performing the current value evaluation includes measuring a plurality of motor current value at the time, each of the motor current values corresponding to a motor current phase. Performing the current value evaluation further includes measuring a phase angle for the each of the motor current values at the time, selecting a peak motor current value from the plurality of motor current values, and comparing the peak motor current value to an existing optimal parking current value. Performing the current value evaluation further includes modifying the existing optimal parking current value to the peak motor current value when the peak motor current value exceeds or is equal to the existing optimal parking current value, modifying an existing optimal parking phase angle to the phase angle of the peak motor current value when the peak motor current value exceeds or is equal to the existing optimal parking current value, and modifying an existing optimal parking phase to the motor current phase of the peak motor current value when the peak motor current value exceeds or is equal to the existing optimal parking current value.

In accordance with another embodiment, a compressor is provided. The compressor includes a housing defining a chamber, a piston disposed and movable within the chamber, a motor driving the piston, and a controller in communication with the motor. The controller is configured for performing a current value evaluation for an initial time during operation of the motor. Performing the current value evaluation includes measuring a plurality of motor current value at the time, each of the motor current values corresponding to a motor current phase. Performing the current value evaluation further includes measuring a phase angle for the each of the motor current values at the time, selecting a peak motor current value from the plurality of motor current values, and comparing the peak motor current value to an existing optimal parking current value. Performing the current value evaluation further includes modifying the existing optimal parking current value to the peak motor current value when the peak motor current value exceeds or is equal to the existing optimal parking current value, modifying an existing optimal parking phase angle to the phase angle of the peak motor current value when the peak motor current value exceeds or is equal to the existing optimal parking current value, and modifying an existing optimal parking phase to the motor current phase of the peak motor current value when the peak motor current value exceeds or is equal to the existing optimal parking current value.

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWINGS

A full and enabling disclosure of the present invention, including the best mode thereof, directed to one of ordinary skill in the art, is set forth in the specification, which makes reference to the appended figures.

FIG. 1 is a front view of a refrigerator appliance in accordance with one embodiment of the present disclosure;

FIG. 2 is a schematic view of a sealed refrigeration system in accordance with one embodiment of the present disclosure;

FIG. 3 is a side cross-sectional view of a rotary compressor for use in a refrigeration system in accordance with one embodiment of the present disclosure;

FIG. 4 is a top cross-sectional view of a piston in a chamber of a rotary compressor, with the piston in an optimal parking position, in accordance with one embodiment of the present disclosure;

FIG. 5 is a top cross-sectional view of a piston in a chamber of a rotary compressor, with the piston in a position between an optimal parking position and a bottom dead center position, in accordance with one embodiment of the present disclosure;

FIG. 6 is a cross-sectional view of a piston in a chamber of a reciprocating compressor, with the piston in an optimal parking position, in accordance with one embodiment of the present disclosure;

FIG. 7 is a cross-sectional view of a piston in a chamber of a reciprocating compressor, with the piston in a position between an optimal parking position and a top dead center position, in accordance with one embodiment of the present disclosure;

FIG. 8 is a graph of current versus time for each phase of a three-phase motor that is operating to move a piston of a compressor in accordance with one embodiment of the present disclosure; and FIG. 9 is a flow chart illustrating a method for determining an optimal parking position for a compressor piston in accordance with one embodiment of the present disclosure.

DETAILED DESCRIPTION

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents.

FIG. 1 depicts a refrigerator appliance 10 that incorporates a sealed refrigeration system 60 (FIG. 2). It should be appreciated that the term "refrigerator appliance" is used in a generic sense herein to encompass any manner of refrigeration appliance, such as a freezer, refrigerator/freezer combination, and any style or model of conventional refrigerator. In addition, it should be understood that the present subject matter is not limited to use in appliances. Thus, the present subject matter may be used for any other suitable purpose, such as vapor compression within air conditioning units or air compression within air compressors.

In the illustrated exemplary embodiment shown in FIG. 1, the refrigerator appliance 10 is depicted as an upright refrigerator having a cabinet or casing 12 that defines a number of internal chilled storage compartments. In particular, refrigerator appliance 10 includes upper fresh-food compartments 14 having doors 16 and lower freezer compartment 18 having upper drawer 20 and lower drawer 22. The drawers 20 and 22 are "pull-out" drawers in that they can be manually moved into and out of the freezer compartment 18 on suitable slide mechanisms.

FIG. 2 is a schematic view of certain components of refrigerator appliance 10, including a sealed refrigeration system 60 of refrigerator appliance 10. A machinery compartment 62 contains components for executing a known vapor compression cycle for cooling air. The components include a compressor 64, a condenser 66, an expansion device 68, and an evaporator 70 connected in series and charged with a refrigerant. As will be understood by those skilled in the art, refrigeration system 60 may include additional components, e.g., at least one additional evaporator, compressor, expansion device, and/or condenser. As an example, refrigeration system 60 may include two evaporators.

Within refrigeration system 60, refrigerant flows into compressor 64, which operates to increase the pressure of the refrigerant. This compression of the refrigerant raises its temperature, which is lowered by passing the refrigerant through condenser 66. Within condenser 66, heat exchange with ambient air takes place so as to cool the refrigerant. A fan 72 is used to pull air across condenser 66, as illustrated by arrows $A_C$, so as to provide forced convection for a more rapid and efficient heat exchange between the refrigerant within condenser 66 and the ambient air. Thus, as will be understood by those skilled in the art, increasing air flow across condenser 66 can, e.g., increase the efficiency of condenser 66 by improving cooling of the refrigerant contained therein.

An expansion device (e.g., a valve, capillary tube, or other restriction device) 68 receives refrigerant from condenser 66. From expansion device 68, the refrigerant enters evaporator 70. Upon exiting expansion device 68 and entering evaporator 70, the refrigerant drops in pressure. Due to the pressure drop and/or phase change of the refrigerant, evaporator 70 is cool relative to compartments 14 and 18 of refrigerator appliance 10. As such, cooled air is produced and refrigerates compartments 14 and 18 of refrigerator appliance 10. Thus, evaporator 70 is a type of heat exchanger which transfers heat from air passing over evaporator 70 to refrigerant flowing through evaporator 70.

Collectively, the vapor compression cycle components in a refrigeration circuit, associated fans, and associated compartments are sometimes referred to as a sealed refrigeration system operable to force cold air through compartments 14, 18 (FIG. 1). The refrigeration system 60 depicted in FIG. 2 is provided by way of example only. Thus, it is within the scope of the present subject matter for other configurations of the refrigeration system to be used as well.

FIG. 3 illustrates a compressor 100, in this case a rotary compressor 100, according to one embodiment of the present disclosure. As discussed in greater detail herein, compressor 100 is operable to increase a pressure of fluid within a chamber 106 of compressor 100. Compressor 100 may be used to compress any suitable fluid, such as refrigerant or air. In particular, compressor 100 may be used in a refrigerator appliance, such as refrigerator appliance 10 (FIG. 1) in which compressor 100 may be used as compressor 64 (FIG. 2).

Referring to FIG. 3, rotary compressor 100 includes a casing 102, which may be hermetic. Disposed within the casing 102 may be a compressor unit 104 which may include a chamber 106 defined within a housing 108, such as a cylinder. A piston 110 may be disposed within the chamber, which may be rotationally driven by an eccentric 112 or otherwise be capable of eccentric rotational movement. In the embodiment shown, for example, eccentric 112 is formed as an integral part of a drive shaft 114 extending downwardly from a motor 116, which may drive the shaft 114 and thus the piston 110.

As shown, a hollow bearing journal 117 formed in the supporting main frame 118 may support the shaft 114 above the eccentric 112 for rotation by the motor 116. It should be noted that the main frame 118 provides the upper end wall enclosing the chamber 106. The opposite or lower end wall 120 encloses the bottom of the compressor chamber 106 and also supports the lower end of the shaft 114.

As may best be seen in FIGS. 4 and 5, the housing 108 is provided with a generally radially extending vane slot 122 having slidably disposed therein a blade or vane 124. The vane 124 is biased by a spring 126 so that its radial inner end 128 is in engagement with a peripheral surface 130 of the piston 110 thereby dividing the chamber 106 into a low and high pressure side designated as 132 and 134 respectively. As shown in FIGS. 4 and 5, the shaft 114 and therefore the eccentric 112 and roller 110 are rotatable in a counterclockwise direction as indicated by the arrow.

The compressor 100 can be connected to a refrigeration system, such as refrigeration system 60. Accordingly, compressor 100 may receive suction or low pressure gas (such as refrigerant) from an evaporator through a suction line 142 (see FIG. 3). Means are provided for delivering the suction gas into the low pressure side 132 of the chamber 106 from the suction line 142. More specifically, these means include an inlet passage 144, which may for example be formed through housing 108 such that the passage 144 is in communication with the chamber 106 through an opening 146 of the passage 144 that is defined in the peripheral wall 148 defining the chamber 106. Low pressure gas may thus flow from suction line 142 through inlet passage 144 into the chamber 106, such as into the low pressure side 132 thereof. Here, the gas may be compressed between the peripheral surface 130 of the piston 110, the sides of the chamber 106, and the vane 124 during rotation of the piston 110 around the chamber.

Means, including an outlet passage 150 and discharge chamber 152 (see FIG. 3) are additionally provided for discharging high pressure gas from the high pressure side 134 of the chamber 106. Outlet passage 150 may for example be formed through housing 108 such that the passage 150 is in communication with the chamber 106 through an opening 156 of the passage 150 that is defined in the peripheral wall 148 defining the chamber 106. After compression thereof, high pressure gas may thus flow from chamber 106, such as high pressure side 134 thereof, through outlet passage 150 into the chamber 152. Such gas may further flow from chamber 152 through a discharge line 166 into a condenser, as is generally understood.

As discussed, the piston 110 has an eccentric rotational movement within chamber 106. Accordingly, during rotation, the peripheral surface 130 generally remains in contact with the peripheral wall 148, as shown in FIGS. 4 and 5. The piston 110 generally rotates in a counter clock-wise direction as shown or clock-wise direction between an optimal parking position, as shown in FIG. 4, and a bottom dead center position (not shown). In exemplary embodiments, the optimal parking position is a top dead center position. FIG. 5 illustrates a position between optimal parking and bottom dead center as the piston rotates from optimal parking towards bottom dead center. Optimal parking position is defined as a position of the piston which facilitates minimal fluid communication between the passages 244, 250 and the chamber 206. In the case of a rotary compressor, optimal parking position can be a position in which the piston 110 is closest to both the inlet passage 144 (such as the opening 146 thereof) and the outlet passage 150 (such as the opening 156 thereof) such that the peripheral surface 130 of the piston completely or substantially seals the openings 146, 156 and fluid communication between the passages 144, 150 and the chamber 106 is completely or substantially prevented. This may for example be top dead center position. Bottom dead center position is an opposite position to top dead center position, after 180 degree rotation of the piston 110, such that the piston 110 is farthest to both the inlet passage 144 (such as the opening 146 thereof) and the outlet passage 150 (such as the opening 156 thereof).

As discussed, motor 116 may drive the drive shaft 114, which may in turn drive the eccentric 112 and piston 110. In exemplary embodiments, motor 116 may be driven by alternating current ("AC") power, such as three-phase electric power or alternatively single-phase electric power, two-phase electric power, etc. In one particular embodiment, motor 116 is a brushless direct current ("DC") electric motor, which includes an integrated inverter/switching power supply to produce AC power to drive the motor.

FIGS. 6 and 7 illustrates a compressor 200 in accordance with another embodiment, in this case a reciprocating compressor 200. As discussed in greater detail herein, compressor 200 is operable to increase a pressure of fluid within a chamber 206 of compressor 100. Compressor 100 may be used to compress any suitable fluid, such as refrigerant or air. In particular, compressor 200 may be used in a refrigerator appliance, such as refrigerator appliance 10 (FIG. 1) in which compressor 200 may be used as compressor 64 (FIG. 2).

Reciprocating compressor 200 includes a casing 102, which may be hermetic. Disposed within the casing may be a compressor unit 104 which may include a chamber 206 defined within a housing 208, such as a cylinder. A piston 210 may be disposed within the chamber, which may be linearly driven in a reciprocating manner by a connecting rod 214, which is connected between the piston 210 and a crankshaft 215 that extends and is connected to a motor 216. The motor may drive the crankshaft 215, which may in turn drive the connecting rod 214, which may in turn drive the piston 210, as is generally understood.

The compressor 200 can be connected to a refrigeration system, such as refrigeration system 60. Accordingly, compressor 200 may receive suction or low pressure gas (such as refrigerant) from an evaporator through a suction line 242. Means are provided for delivering the suction gas into the chamber 206 from the suction line 242. More specifically, these means include an inlet passage 244, which may for example be formed through housing 208 such that the passage 244 is in communication with the chamber 206 through an opening 246 of the passage 244 that is defined in a wall 248 defining the chamber 206. Low pressure gas may thus flow from suction line 242 through inlet passage 244 into the chamber 206. Here, the gas may be compressed between a surface 230 of the piston 210 and the sides of the chamber 206 during linear movement of the piston 210. Additionally, in a typical reciprocating compressor, a valve 247 may be positioned in the opening 246. Low pressure gas may thus flow through the valve 247, which may alternately open and close during operation as is generally understood.

Means, including an outlet passage 250 are additionally provided for discharging high pressure gas from the chamber 206. Outlet passage 250 may for example be formed through housing 208 such that the passage 250 is in communication with the chamber 206 through an opening 256 of the passage 250 that is defined in the wall 248 defining the chamber 206. After compression thereof, high pressure gas may thus flow from chamber 206 through outlet passage 250 into the chamber 252. Additionally, in a typical reciprocating compressor, a valve 257 may be positioned in the opening 256. High pressure gas may thus flow through the valve 257, which may alternately open and close during operation as is generally understood. Such gas may further flow from chamber 252 through a discharge line 266 into a condenser, as is generally understood.

As discussed, the piston 210 has a linear movement in a reciprocating manner within chamber 206. Accordingly, during linear movement, the piston 110 generally reciprocates between an optimal parking position and other various positions. In the embodiment shown, the piston reciprocates between an optimal parking position, as shown in FIG. 6, and a top dead center position (not shown). In exemplary embodiments, the optimal parking position is a bottom dead center position. FIG. 7 illustrates a position between optimal parking and top dead center as the piston reciprocates from optimal parking towards top dead center. Optimal parking position is defined as a position of the piston which facilitates minimal fluid communication between the passages 244, 250 and the chamber 206.

As discussed, motor 216 may drive the drive shaft 214, which may in turn drive the piston 210. In exemplary embodiments, motor 216 may be driven by alternating current ("AC") power, such as three-phase electric power or alternatively single-phase electric power, two-phase electric power, etc. In one particular embodiment, motor 216 is a brushless direct current ("DC") electric motor, which includes an integrated inverter/switching power supply to produce AC power to drive the motor.

It should be noted that the present disclosure is not limited to the compressor embodiments discussed herein. Rather, any suitable configurations of a reciprocating or rotary compressor, as well as other suitable positive displacement compressors such as scroll or screw compressors, are within the scope and spirit of the present disclosure. It should further be understood that the optimal parking position is not limited to top dead center or bottom dead center, but rather is the position of the piston which facilitates minimal fluid communication between the passages 244, 250 and the chamber 206.

As discussed, it would be desirable to place the piston 110, 210 at optimal parking position when the motor 116, 216 is turned off and movement of the piston 110, 210 is stopped. The present inventors have advantageously discovered that motor current values generated during operation of the motor 116, 216 and compressor 100, 200 generally can be utilized to determine when the piston 110, 210 is at the optimal parking position. Specifically, the present inventors have discovered that peak current values of the one or more current phases generated during operation of the motor 116, 216 correspond to the optimal parking position. These peak current values can thus advantageously be utilized to facilitate updates of stored optimal parking positions for the piston 100, 200 and further provide relatively accurate optimal parking position determinations.

It should be noted that the term "peak" may be utilized to refer to either maximum or minimum values. For example, in various embodiments such as those involving positive values, peak values may be maximum values of those positive values. In various embodiments such as those involving negative values, peak values may be minimum values of those negative values. It should further be noted that the term "exceeds" may be utilized to refer to either "greater than" or "less than" comparisons. For example, in various embodiments such as those involving positive values, the term "exceeds or is equal to" means "is greater than or equal to". In various embodiments such as those involving negative values, the term "exceeds or is equal to" means "is less than or equal to".

Referring now to FIG. 8, a graph of current versus time for a three-phase alternating current power supply driving a motor 116, 216 during operation of a compressor 100, 200 is illustrated. As illustrated, the current values I(a), I(b), I(c) of each phase A, B, C are increasing as the motor 116, 216 drives the piston 110, 210 towards and to the optimal parking position. In particular, a peak motor current value, phase angle, and phase may be associated with the optimal parking position, such that these values indicate that the piston 110, 210 is at or approximately at the optimal parking position.

As such, and referring now to FIG. 9, the present disclosure is further directed to methods for determining an optimal parking for a compressor piston 110, 210. Such methods, as indicated by reference numeral 300, may for example be performed by a suitable controller 180, 280, which may be in communication with the motor 116, 216 as well as the compressor 100, 200 generally, refrigeration system 60, and refrigerator 10. Controller 180, 280 may be configured for performing the various method steps as disclosed herein. For example, controller 180, 280 may include a memory and one or more microprocessors, CPUs or the like, such as general or special purpose microprocessors operable to execute programming instructions or microcontrol code associated with operation of motor 116, 216 and other various components. The memory may represent random access memory such as DRAM, or read only memory such as ROM or FLASH. In one embodiment, the processor executes programming instructions stored in memory. The memory may be a separate component from the processor or may be included onboard within the processor. Input/output ("I/O") signals may be routed between the controller and various operational components of motor 116, 216 as well as other suitable apparatus, via suitable wired or wireless connections as is generally understood.

Method 300 may include, for example, the step 310 of performing a current value evaluation for an initial time 312 during operation of the motor 116, 216. Notably, a time 312 as discussed herein may be a specific time datum point, such as a time as illustrated along the x-axis in FIG. 8, or a time period encompassing a range of time datum points. Method 300 may further include, for example, the step 315 of performing the current value evaluation at a subsequent time 312 or a plurality of subsequent times 312. In exemplary embodiments, for example, method 300 in a manner so as to provide closed-loop feedback during operation of the motor 116, 216, in order to facilitate real-time updating of the current value, phase angle, and phase associated with the optimal parking position.

Each step 310, 315 may, for example, include a plurality of steps for updating the various values associated with the optimal parking position. For example, steps, 310, 315 may include the step 320 of measuring one or more motor current values I(a), I(b), I(c) at the time 312. In embodiments wherein more than one motor current value I(a), I(b), I(c) measured, it should be generally understood that each motor current value I(a), I(b), I(c) may correspond to a motor current phase A, B, C. In exemplary embodiments as illustrated, for example, three motor current values I(a), I(b), I(c), which correspond to the phases of a three-phase motor 116, 216 are utilized and measured.

Notably, in embodiment wherein the time 312 is a time datum point, the specific motor current values I(a), I(b), I(c) may be measured. In embodiments wherein the time 312 is a time period, the measured motor current values I(a), I(b), I(c) may be peak motor current values I(a), I(b), I(c) experienced during the time period.

Steps 310, 315 may further include the step 330 of measuring a phase angle $\phi$ for each of the one or more motor current values I(a), I(b), I(c), as is generally understood.

In embodiments wherein more than one motor current value I(a), I(b), I(c) are measured, steps 310, 315 may additionally include, for example, the step 340 of selecting a peak motor current value I(max) from the motor current values I(a), I(b), I(c).

Steps 310, 315 may further include the step 350 of comparing the measured motor current value or peak motor current value I(max) to an existing optimal parking current value I(tdc). Further, steps 310, 315 may include the step 360 of modifying the existing optimal parking current value I(tdc) to the motor current value or peak motor current value I(max) when the motor current value or peak motor current value I(max) exceeds or is equal to the existing optimal parking current value I(tdc). Accordingly, the current value associated with the optimal parking position may be updated to be a peak of the current values experienced during operation, such that accurate positioning of the piston 110, 210 at the optimal parking position is facilitated.

Steps 310, 315 may further include the step 370 of modifying an existing optimal parking phase angle $\phi$(tdc) to the phase angle $\phi$, such as the phase angle $\phi$ of the peak motor current value I(max) when a plurality of motor current values are measured, when the motor current value or peak motor current value I(max) exceeds or is equal to the existing optimal parking current value I(tdc). Accordingly, the phase angle of the current value associated with the optimal parking position may additionally be updated, such that accurate positioning of the piston 110 at the optimal parking position is further facilitated.

In embodiments wherein a plurality of motor current values are measured, steps 310, 315 may further include the step 380 of modifying an existing optimal parking phase P(tdc) to the motor current phase A, B, C of the peak motor current value I(max) when the peak motor current value I(max) exceeds or is equal to the existing optimal parking current value I(tdc). Accordingly, the phase of the current value associated with the optimal parking position may additionally be updated, such that accurate positioning of the piston 110, 210 at the optimal parking position is further facilitated.

It should be understood that, when the motor current value or peak motor current value I(max) is less than the existing optimal parking current value (I(tdc)), the existing optimal parking current value I(tdc), existing optimal parking phase angle $\phi$(tdc), and existing optimal parking phase P(tdc) may remain as they exist, with no modification. Accordingly, all values associated with peak current values in these embodiments are maintained.

Notably, after step 310 and one or more iterations of step 315, it may be desirable to store the existing optimal parking current value I(tdc), existing optimal parking phase angle $\phi$(tdc), and existing optimal parking phase P(tdc). For example, a predetermined time period limit 392 may be set in which step 310 and step(s) 315 are performed, after which such existing variables may be stored. Accordingly, method 300 may further include the step of storing the existing optimal parking current value I(tdc), existing optimal parking phase angle $\phi$(tdc), and optional existing optimal parking phase P(tdc) when a time period 394 between the initial time 312 and a latest time of the plurality of subsequent times 312 exceeds or is equal to the predetermined time period limit 392. Method 300 may then be repeated as desired, such as in a closed loop manner as discussed. The stored existing values, however, may advantageously be utilized to facilitate accurate positioning of the piston 110, 210 at the optimal parking position as desired.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. A method for determining an optimal parking position for a compressor piston, the method comprising performing a current value evaluation for an initial time during operation of a motor of the compressor, wherein performing the current value evaluation comprises:
    measuring a plurality of motor current values at the initial time, each of the motor current values corresponding to a motor current phase;
    comparing each motor current value to an existing optimal parking current value;
    modifying the existing optimal parking current value to the motor current value when the motor current value exceeds or is equal to the existing optimal parking current value; and
    modifying an existing optimal parking phase to the motor current phase of the peak motor current value when the peak motor current value exceeds or is equal to the existing optimal parking current value.

2. The method of claim 1, further comprising performing the current value evaluation at a subsequent time.

3. The method of claim 2, wherein the subsequent time is a plurality of subsequent times.

4. The method of claim 3, further comprising storing the existing optimal parking current value when a time period between the initial time and a latest time of the plurality of subsequent times exceeds or is equal to a predetermined time period limit.

5. The method of claim 1, further comprising:
    measuring a phase angle for the motor current value at the initial time; and
    modifying an existing optimal parking phase angle to the phase angle when the motor current value exceeds or is equal to the existing optimal parking current value.

6. The method of claim 1, wherein the plurality of motor current values is three motor current values.

7. The method of claim 1, further comprising selecting a peak motor current value from the plurality of motor current values.

8. The method of claim 1, wherein the comparing step comprises comparing the peak motor current value to the existing optimal parking current value, wherein the step of modifying the existing optimal parking current value comprises modifying the existing optimal parking current value to the peak motor current value when the peak motor current value exceeds or is equal to the existing optimal parking current value, and wherein the step of modifying the existing optimal parking phase angle comprises modifying the existing optimal parking phase angle to the phase angle of the peak motor current value when the peak motor current value exceeds or is equal to the existing optimal parking current value.

9. A method for determining an optimal parking position for a compressor piston, the method comprising performing a current value evaluation for an initial time during operation of a motor of the compressor, wherein performing the current value evaluation comprises:
    measuring a plurality of motor current value at the initial time, each of the motor current values corresponding to a motor current phase;
    measuring a phase angle for the each of the motor current values at the initial time;
    selecting a peak motor current value from the plurality of motor current values;
    comparing the peak motor current value to an existing optimal parking current value;
    modifying the existing optimal parking current value to the peak motor current value when the peak motor current value exceeds or is equal to the existing optimal parking current value;
    modifying an existing optimal parking phase angle to the phase angle of the peak motor current value when the peak motor current value exceeds or is equal to the existing optimal parking current value; and
    modifying an existing optimal parking phase to the motor current phase of the peak motor current value when the peak motor current value exceeds or is equal to the existing optimal parking current value.

10. The method of claim 9, wherein the plurality of motor current values is three motor current values.

11. The method of claim 9, further comprising performing the current value evaluation at a subsequent time.

12. The method of claim 11, wherein the subsequent time is a plurality of subsequent times.

13. The method of claim 12, further comprising storing the existing optimal parking current value and existing optimal parking phase angle when a time period between the initial time and a latest time of the plurality of subsequent times exceeds or is equal to a predetermined time period limit.

14. A compressor, comprising:
    a housing defining a chamber;
    a piston disposed and movable within the chamber;
    a motor driving the piston; and
    a controller in communication with the motor, the controller configured for performing a current value evaluation for an initial time during operation of the motor, wherein performing the current value evaluation comprises:
        measuring a plurality of motor current value at the initial time, each of the motor current values corresponding to a motor current phase;
        measuring a phase angle for the each of the motor current values at the initial time;
        selecting a peak motor current value from the plurality of motor current values;
        comparing the peak motor current value to an existing optimal parking current value;
        modifying the existing optimal parking current value to the peak motor current value when the peak motor current value exceeds or is equal to the existing optimal parking current value;
        modifying an existing optimal parking phase angle to the phase angle of the peak motor current value when the peak motor current value exceeds or is equal to the existing optimal parking current value; and
        modifying an existing optimal parking phase to the motor current phase of the peak motor current value when the peak motor current value exceeds or is equal to the existing optimal parking current value.

15. The compressor of claim 14, wherein the plurality of motor current values is three motor current values.

16. The compressor of claim 14, wherein the controller is further configured for performing the current value evaluation at a subsequent time.

17. The compressor of claim 16, wherein the subsequent time is a plurality of subsequent times.

18. The compressor of claim 17, wherein the controller is further configured for storing the existing optimal parking current value and existing optimal parking phase angle when a time period between the initial time and a latest time of the plurality of subsequent times exceeds or is equal to a predetermined time period limit.

* * * * *